(12) United States Patent
Liu et al.

(10) Patent No.: US 11,799,393 B2
(45) Date of Patent: Oct. 24, 2023

(54) DISPERSED CARRIER PHASE-SHIFTING METHOD AND SYSTEM

(71) Applicant: Delta Electronics (Shanghai) Co., Ltd., Shanghai (CN)

(72) Inventors: Hong Liu, Shanghai (CN); Wen Zhang, Shanghai (CN); Wenfei Hu, Shanghai (CN); Cheng Lu, Shanghai (CN); Hongyang Wu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/817,656

(22) Filed: Aug. 5, 2022

(65) Prior Publication Data
US 2023/0068964 A1    Mar. 2, 2023

(30) Foreign Application Priority Data

Aug. 26, 2021    (CN) .......................... 202110986564.7

(51) Int. Cl.
*H02M 7/493* (2007.01)
*H02M 7/5395* (2006.01)
*H02M 7/483* (2007.01)
*H03K 5/01* (2006.01)

(52) U.S. Cl.
CPC .......... *H02M 7/493* (2013.01); *H02M 7/483* (2013.01); *H02M 7/5395* (2013.01); *H03K 5/01* (2013.01)

(58) Field of Classification Search
CPC .... H02M 7/483; H02M 7/493; H02M 7/5395; H03K 5/01
See application file for complete search history.

(56) References Cited

U.S. PATENT DOCUMENTS

| | | | |
|---|---|---|---|
| 7,808,125 B1* | 10/2010 | Sachdeva | H02M 7/49 363/55 |
| 2020/0313567 A1* | 10/2020 | Porter, Jr. | H02M 3/33507 |
| 2021/0258000 A1* | 8/2021 | Xu | H03K 3/84 |

FOREIGN PATENT DOCUMENTS

| | | |
|---|---|---|
| CN | 109818512 A | 5/2019 |
| CN | 110474549 A | 11/2019 |

* cited by examiner

*Primary Examiner* — Jue Zhang
(74) *Attorney, Agent, or Firm* — CKC & Partners Co., LLC

(57) ABSTRACT

The application provides a dispersed carrier phase-shifting method and system. The method includes connecting at least two power modules to form a modular system; each power module including a control module for sampling at least twice a common state variate, signs of slopes of the common state variate at a first and second sampling time are opposite, and a reference time of the first sampling time for each control module is the same; and regulating a carrier frequency of the power module according to a relative size between a sampled values at the first and second sampling time. According to embodiments herein, carrier phase-shifting of modular system may be implemented without communication between respective modules. Under closed-loop control, optimal carrier phase-shifting can be automatically achieved under various duty ratios, thereby having good stability.

24 Claims, 15 Drawing Sheets

DISPERSED CARRIER PHASE-SHIFTING METHOD AND SYSTEM

CROSS-REFERENCE TO RELATED APPLICATIONS

This non-provisional application claims priority under 35 U.S.C. § 119(a) on Patent Applications No. 202110986564.7 filed in P.R. China, on Aug. 26, 2021, the entire contents of which are hereby incorporated by reference.

Some references, if any, which may include patents, patent applications and various publications, may be cited and discussed in the description of this application. The citation and/or discussion of such references, if any, is provided merely to clarify the description of the present application and is not an admission that any such reference is "prior art" to the application described herein. All references listed, cited and/or discussed in this specification are incorporated herein by reference in their entireties and to the same extent as if each reference was individually incorporated by reference.

FIELD

The present application relates to the field of carrier phase-shifting techniques, and particularly to a dispersed carrier phase-shifting method and system.

BACKGROUND

Modular power electronic systems can be used in wide applications. For example, in order to cope with a high voltage power grid, a plurality of power modules are connected in series to form a cascade system, such that a withstand voltage of each power module is reduced. The cascade system is widely applied in products such as medium voltage motor driven frequency converters, power electronic transformers, high voltage Static Var Generators (SVG), and the like. For another example, a plurality of power modules are connected in parallel to form a parallel system, and the parallel system is widely applied in fields such as new energy power generation, energy storage, and the like.

As for control of the system, generally, controllers are mounted on the power modules to form a distributed control system, such that the modular system has good flexibility, extendibility and reliability. To exploit advantages of the modular system, coordinated operation between the modules is necessary. For example, a carrier phase-shifting technique between the modules allows switches of each of the power modules to act alternatively, thereby significantly reducing a total output voltage or current harmonic of the modular system. The existing carrier phase-shifting technique is often based on communication mode, wherein a reference module or a main controller sends a synchronous signal to each power module simultaneously, and after each power module detects the synchronous signal, its own carrier phase is adjusted to the corresponding phase-shifting angle according to numbers of the power modules. However, the method needs participation of communication lines, and has a high requirement for reliability of communication. In actual communication, there is a need for the system to continue to operate stably without relying on communication when communication occurs a fault.

To solve the problem, the conventional techniques generally use the method of sampling the common state variate, in which the common state variate refers to a variate that can be sampled at ports of the respective power modules and consistent for each module, such as, a current of a cascade H-bridge system, a parallel-connection point voltage of a multi-module parallel inverter system. Each power module obtains a signal zero-crossing point by sampling a same current or voltage signal, while updating the respective carrier waves to the phase-shifting angles corresponding to serial-number. However, the requirement for accuracy of zero-crossing detection in such method is high, and serial numbers of the power modules are also needed. When the number of power modules in operation changes, for example, when a power module occurs a fault, and thus sequence of the numbers changes, the numbers of the modules shall be rearranged through communication, while cannot completely get rid of dependency on communication.

SUMMARY

In such background, one aspect of the disclosure is to provide a dispersed carrier phase-shifting method, through which carrier phase-shifting of the series or parallel modular system may be implemented without communication mode.

According to one aspect of the disclosure, a dispersed carrier phase-shifting method is provided, the method including the steps of:
  connecting at least two power modules in series and/or in parallel to form a modular system;
  each of the power modules including a control module for sampling at least twice a common state variate, a sign of a slope of the common state variate sampled at a first sampling time is opposite to a sign of a slope of the common state variate sampled at a second sampling time, and a reference time at the first sampling time for of each of the control modules is the same; and
  regulating a carrier frequency of the power module according to a relative size between a sampled value at the first sampling time and a sampled value at the second sampling time.

According to another aspect of the disclosure, provided is a dispersed carrier phase-shifting system, including:
  a modular system formed by connecting at least two power modules in series and/or in parallel;
  each of the power modules including a control module,
  the control module for sampling at least twice a common state variate, a sign of a slope of the common state variate sampled at a first sampling time is opposite to a sign of a slope of the common state variate at a second sampling time, and a reference time of each of the control modules at the first sampling time being the same; and
  regulating a carrier frequency of the power module according to a relative size between a sampled value at the first sampling time and a sampled value at the second sampling time.

In the dispersed carrier phase-shifting method provided in the embodiments, a control module is provided in each power module for sampling at least twice a common state variate with a same reference time of first sampling time for each of the control modules, such that a sign of a slope of the common state variate sampled at a first sampling time is opposite to a sign of a slope of the common state variate sampled at a second sampling time, and then a carrier frequency of the power module is regulated according to a relative size between a sampled value at the first sampling time and a sampled value at the second sampling time. The dispersed carrier phase-shifting method may implement carrier phase-shifting of the series or parallel modular system without mutual communication between the control modules, and meanwhile, under closed-loop control, an optimal carrier phase-shifting can be automatically achieved under various working conditions of duty ratios, thereby having good stability. Moreover, the method may automatically support power module exit operation of the or power module load operation, thereby realizing redundancy operation and plug and play.

In addition, the dispersed carrier phase-shifting method in the embodiments of the application also may be applied to multiple modular series and parallel systems such as a three phase Y-connection cascade system, a three phase delta-connection cascade system, a multi-module LLC resonant converter parallel system, a MMC modular multi-level converter, or a medium and high voltage DC/DC converter formed by cascade bridges, and has great significance to improvement of flexibility and extendibility of the modular system.

BRIEF DESCRIPTION OF THE DRAWINGS

The above and other objects, features and advantages of the disclosure become more apparent according to detailed descriptions with reference to the accompanying drawings, wherein.

DETAILED DESCRIPTION

Figure 1:
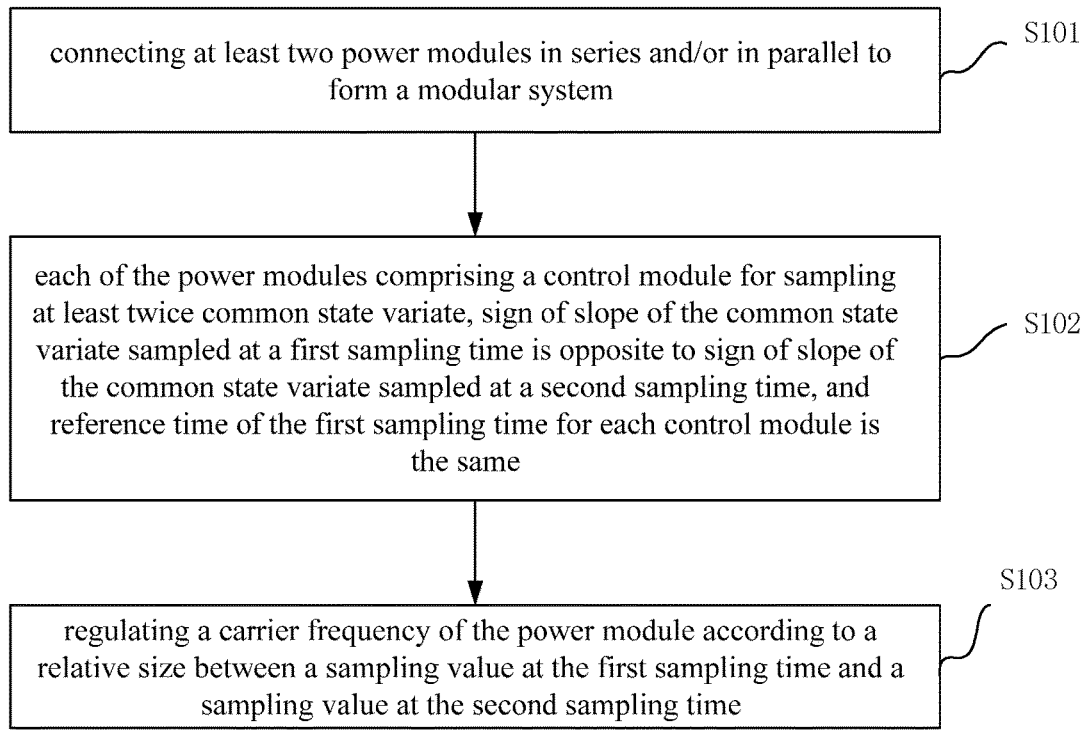
FIG. 1 is a flow chart of a dispersed carrier phase-shifting method according to the application.

To illustrate the object, technical solutions and advantages of the invention more clearly, hereinafter the invention is further explained in details with reference to the accompany drawings and embodiments. It shall be understood that the detailed embodiments described here are only to explain the invention, not limiting the invention.

It shall be noted that when the specification specifies reference signs for elements in the drawings, although the same reference sign is shown in different drawings, the same reference sign represents the same element as could as possible. In addition, in the below description of the disclosure, when detailed descriptions of the known functions and constructions incorporated into the invention make the subject matter of the disclosure quite unclear, the detailed descriptions will be omitted.

Further, when the elements in the disclosure are described, terms such as "first", "second", "A", "B", "(a)", "(b)" and the like may be used. These terms are only to distinguish one element from other elements, and essence, order, sequence, or number of the corresponding element is not limited thereto. When one element is described to be "connected to", "coupled to" or "linked to" another element, it shall be understood that one element can be directly connected or coupled to another element, and also can be "connected to", "coupled to" or "linked to" another element via a third element, or the third element may be interposed between one element and another element.

Still further, with respect to citation of "one embodiment", "embodiments", "exemplary embodiment", or the like, it refers to that the described embodiment may include specific features, structures or characteristics, not that each embodiment must include these specific features, structures or characteristics. In addition, such expression does not refer to the same embodiment. Further, when the specific features, structures or characteristics are described combining with the embodiments, no matter whether they are clearly described, it has indicated that combination of these features, structures or characteristics into other embodiments is within the scope of knowledge of those skilled in the art.

Even further, the specification and subsequent claims use certain phrases to name specific components or parts, and those ordinary in the art shall understood that manufacturers can use different nouns or terms to call the same component or part. The specification and subsequent claims do not distinguish the components or parts with difference of names, but difference in functions as distinguishing criterion. In the whole specification and subsequent claims, "comprise" and "include" mentioned are open words, so they shall be explained to "include but not limited to". Moreover, the word "connect" includes any direct or indirect electrical connection means. Indirect electrical connection means includes connection through other devices.

FIG. 1 is a flow chart of a dispersed carrier phase-shifting method according to one embodiment of the disclosure.

Figure 2:
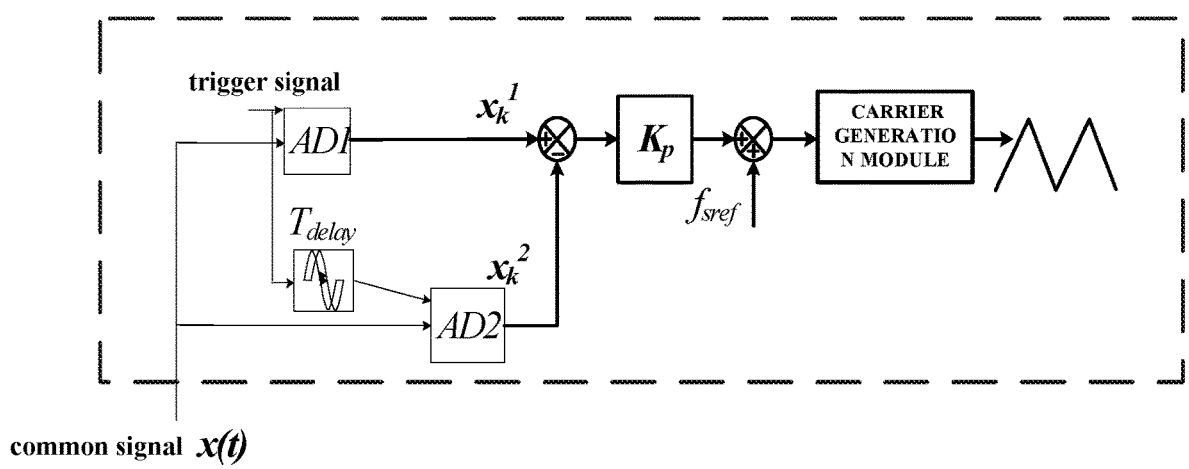
FIG. 2 is a view illustrating control principle of the dispersed carrier phase-shifting method according to the application.

FIG. 2 is a view illustrating control principle of the dispersed carrier phase-shifting method according to the embodiment of the disclosure.

As an example, this embodiment provides a dispersed carrier phase-shifting method, the method including the steps of:

S101, connecting at least two power modules in series and/or in parallel to form a modular system;

S102, each of the power modules including a control module for sampling at least twice a common state variate, a sign of a slope of the common state variate sampled at a first sampling time is opposite to a sign of a slope of the common state variate sampled at a second sampling time, and a reference time the first sampling time for each of the control modules is the same.

In implementation, the modular system can be a cascade system formed by a plurality of power modules connected in series, and also can be a parallel system formed by a plurality of power modules connected in parallel. As for the cascade system, the common state variate is a current flowing all power modules, and as for the parallel modular system, the common state variate is a parallel port voltage. As for the common state variate sampled at the first sampling time and the second sampling time, it shall be ensured that sampling slopes within a time interval between the two samplings are opposite in signs, while also ensuring each power module preforms sampling at a specific time of its own carrier cycle, and a reference time of the first sampling time for the respective control modules is the same. As for selection of the reference time of the first sampling time, it is possible to select a rising edge or a falling edge of respective switch, or a time lagging a same time interval from the rising edge or the falling edge, and/or a time when respective carrier wave itself crosses zero or a peak value as the reference time.

Meanwhile, in order to ensure that a difference of sampled values between the two adjacent sampling times can reflect a relative phase relation between the respective power modules, a certain time interval is necessary between the two adjacent sampling times to ensure that a voltage level of a bridge arm voltage of at least one power module changes between the two adjacent sampling times, such that the voltage level change can be advanced or postponed through regulation of a carrier phase, thereby changing a difference between the two sampled values. Since if the carrier phase-shifting reaches a steady state, currents or voltages at two interval points of an equivalent carrier cycle at the two adjacent sampling times are equal, and in the equivalent carrier cycle, there is just one time where the voltage level of the bridge arm voltage of the at least one power module changes. Therefore, preferably, an interval between the two adjacent sampling times in the application is an equivalent carrier cycle $T_{eq}$, i.e., a sampling interval $T_{delay}=T_{eq}$. When bipolar modulation is used, $$T_{eq} = \frac{T_s}{N};$$

and when doubling frequency unipolar modulation is used, $$T_{eq} = \frac{T_s}{2N};$$

wherein $T_s$ is a carrier cycle of the power module, and N is the number of power modules, where $N \geq 2$.

S103, regulating a carrier frequency of the power module according to a relative size between a sampled value at the first sampling time and a sampled value at the second sampling time. In particular, the relative size between a sampled value at the first sampling time and a sampled value at the second sampling time of the k-th power module is taken as an input of a regulation controller, and an output of the regulation controller is added to a preset carrier frequency to obtain an actual carrier frequency of the power module; and the actual carrier frequency is taken as an input of a carrier generation module to produce a driving signal of the power module.

In implementation, the regulation controller can select a proportional (P) controller, a proportional integral (PI) controller, a proportional differential (PD) controller or a proportional integral differential (PID) controller. In this embodiment, the proportional controller is selected as the regulation controller, $K_p$ is a proportional control coefficient of the proportional controller, and a value of $K_p$ can be determined by $$\begin{cases} K_p < 0, w \text{ end} < 1/N \\ K_p > 0, w \text{ end} > 1/N \end{cases},$$

wherein d is a duty ratio of the power module, and N is the number of power modules. That is, after reaching the optimal carrier phase-shifting, the sampled value at the first sampling time and the sampled value at the second sampling time of each power module can be equal, and it is also possible that a static difference between the sampled value at the first sampling time and the sampled value at the second sampling time of each power module is equal.

Meanwhile, in the application, sampling of the common state variate is not limited to twice, and sampling is performed M times in each cycle, so the actual carrier frequency of the k-th power module is represented as:

$$f_k = f_{sref} + K_p \left( a_k^1 - \frac{a_k^1 + a_k^2 + \ldots + a_k^M}{M} \right),$$

wherein $f_{sref}$ is the preset carrier frequency of the power module, $a_k^i$, i=1, ..., M is a sampled value of the k-th power module at the i-th sampling time, and M represents the number of samplings in the carrier cycle $T_s$ of the power module. When each sampling is equal to an average value of M sampled values, i.e the M sampled values are consistent, the optimal carrier phase-shifting state is reached. In one embodiment, the number of samplings M is equal to the number of power modules N.

As is discussed previously, as for the modular system, coordinated operation between the modules through carrier phase-shifting is indispensable. However, in relevant techniques, requirement for accuracy of zero-crossing detection in the method of sampling the common state variate is high, and serial numbers of the power modules are also needed. When the number of power modules in operation changes, and thus sequence of the numbers changes, the numbers of the modules shall be rearranged using communication, while cannot completely get rid of dependency on communication.

However, as for the dispersed carrier phase-shifting method in the embodiment of the application, a control module is provided for each power module with no communication between respective control modules, each control module samples at least twice a common state variate, in which a reference time of a first sampling time for each control module is the same, such that a sign of a slope of the common state variate at a first sampling time is opposite to a sign of a slope of the common state variate at a second sampling time, and then a carrier frequency of the power module is regulated according to a relative size between a sampled value at the first sampling time and a sampled value at the second sampling time. The dispersed carrier phase-shifting method may implement carrier phase-shifting of the series or parallel modular system without mutual communication between the control modules, and meanwhile, under closed-loop control, the optimal carrier phase-shifting can be automatically achieved under various working conditions of duty ratios, thereby having good stability.

Figure 3:
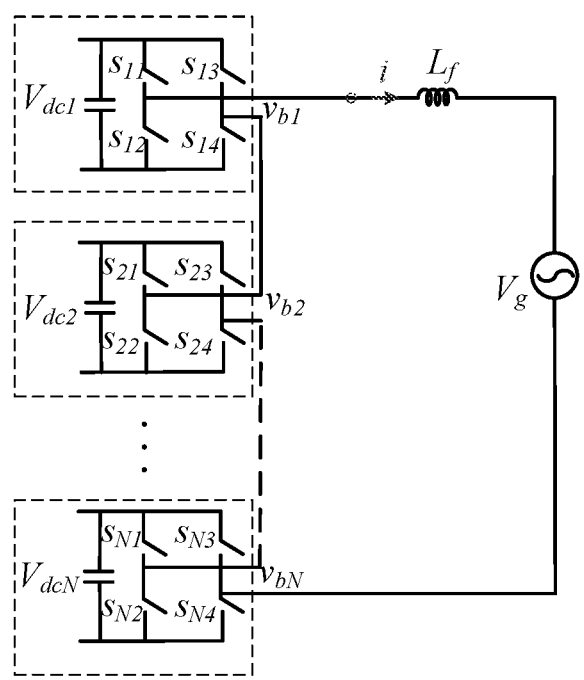
FIG. 3 is a view illustrating circuit principle of a cascade system.
Figure 4:
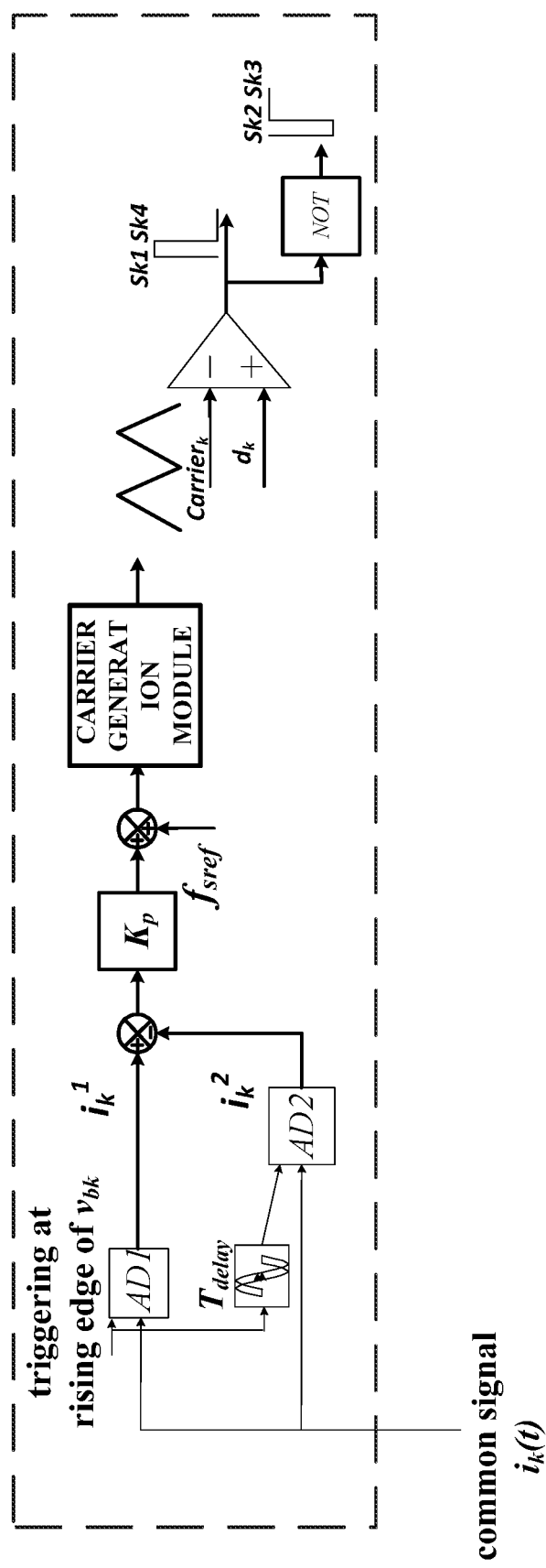
FIG. 4 is a view illustrating control principle of the dispersed carrier phase-shifting method in the example of the cascade system shown in FIG. 3.

As shown in FIG. 3, taking carrier phase-shifting control of the cascade system for example, the cascade system is a series modular system formed by connecting outputs of at least two power modules in series, and the common state variate is an output current flowing all power modules, and a proportional controller is selected as the carrier phase-shifting regulation controller. As shown in FIG. 4, as for carrier phase-shifting control of the k-th power module, the common state variate sampled by the control module is a current i flowing the power module, wherein $i_k^1$ is a first current sampled value of the k-th power module sampled at a first sampling time, and $i_k^2$ is a second current sampled value of the k-th power module sampled at a second sampling time. The first sampling is performed at a rising edge of a bridge arm voltage $V_{bk}$ of the power module k, i.e., a rising edge of switches SK1 and SK4 of the cascade system shown in FIG. 3, and the second sampling lags a certain time interval $T_{delay}$ from the first sampling. A difference between the first current sampled value $i_k^1$ and the second current sampled value $i_k^2$ is taken as an input of the proportional controller, $K_p$ is a proportional control coefficient, and an output of the proportional controller is added to the preset carrier frequency $f_{sref}$ of the module to obtain an actual carrier frequency of the power module. The actual carrier frequency is taken as an input of a carrier generation module. The carrier generation module generates a triangle carrier wave, and the triangle carrier wave is compared with a duty ratio $d_k$ of the k-th power module to produce a driving signal of the switches SK1 and SK4, and then produce a driving signal of switches SK2 and SK4 by taking a logic NOT. The duty ratio is produced by additional closed-loop control of current or voltage. The carrier phase-shifting method in the application is not limited to combine with one control algorithm.

Figure 5:
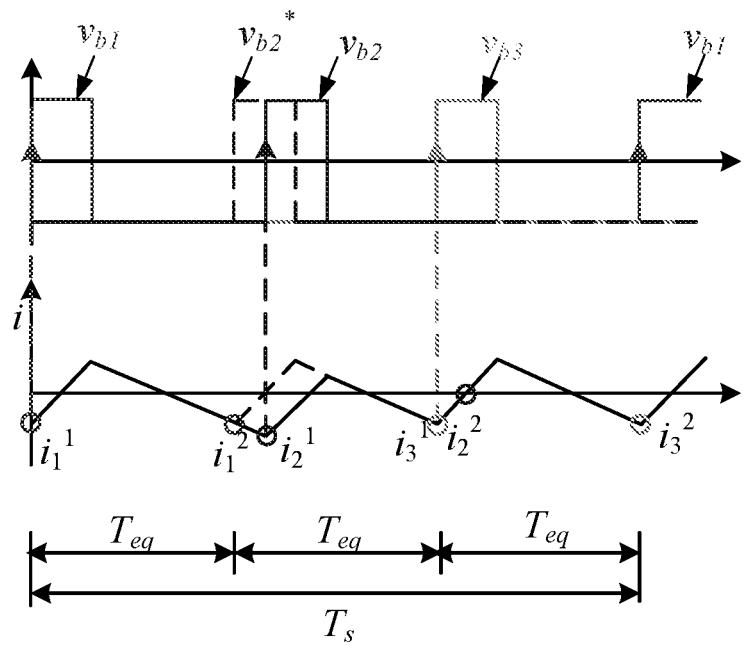
FIG. 5 is a schematic view of carrier phase-shifting when d<1/N.

Taking N=3 power modules for example, FIG. 5 is a schematic view of carrier phase-shifting when d<1/N, wherein d is a duty ratio of the respective power modules, assuming that the duty ratios of the respective power modules are the same. Solid lines represent positions of a bridge arm voltage and current produced by the current carrier wave, and dashed lines represent positions of the optimal bridge arm voltage and current under ideal carrier phase-shifting. The first current sampling is performed at a rising edge of the bridge arm voltage $V_{bk}$ of the k-th power module, and the second sampling lags a certain time interval (i.e., a carrier cycle $T_s$) from the first sampling. In FIG. 5, the current bridge arm voltage $v_{b2}$ of the second power module lags from a position of the ideal bridge arm voltage $v_{b2}^*$ by a very small angle, causing that a difference of currents between the two points sampled at the second power module is $i_2^1 - i_2^2 < 0$. At this time, the proportional control coefficient $K_p$ is less than 0, and the carrier frequency of the second power module is increased, such that the carrier wave of the second power module is shifted to the left, and the second power module moves gradually to the optimal carrier wave position through continuous closed-loop regulation, thereby finally ensuring equal spaced carrier phase-shifting of the three power modules.

Figure 6:
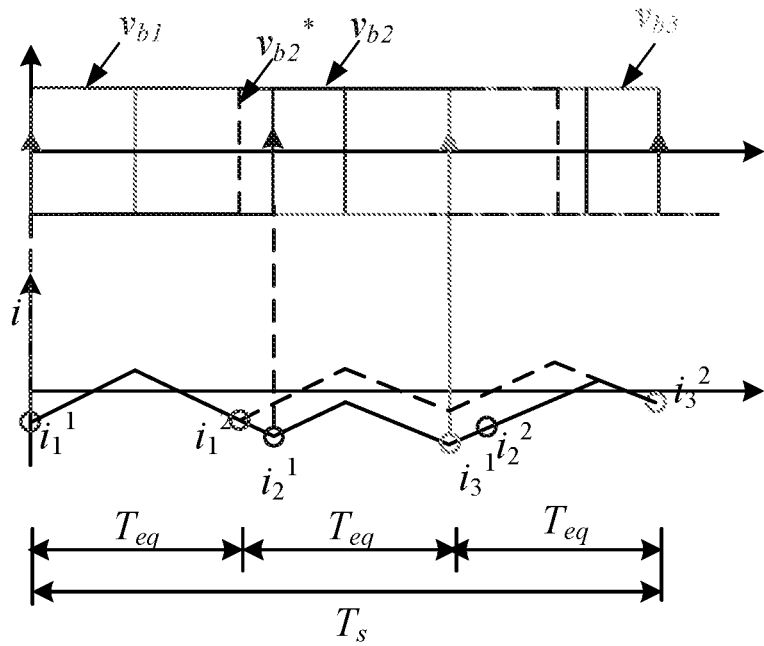
FIG. 6 is a schematic view of carrier phase-shifting when d>1/N.

FIG. 6 is a schematic view of carrier phase-shifting when d>1/N. As can be seen from the figure, the current bridge arm voltage $v_{b2}$ of the second power module lags from a position of the ideal bridge arm voltage $v_{b2}^*$ by a very small angle, causing that a difference of currents between the two points sampled at the third power module is $i_3^1 - i_3^2 < 0$. At this time, the proportional control coefficient $K_p$ is greater than 0, and the carrier frequency of the third power module is decreased, such that the carrier frequency is reduced, phases of the carrier wave and the bridge arm voltage are shifted to the right, and the bridge arm voltage of the third power module lags from the bridge arm voltage of the second power module by a longer time. Then, the phase of the carrier wave of the first power module is further shifted to the right, thereby finally ensuring equal spaced carrier phase-shifting of the three power modules.

Meanwhile, as for the cascade system with the number of power modules N>3, in one power frequency cycle, since a time when d>1/N is longer than that when d<1/N, the proportional control coefficient $K_p$ of the proportional controller in the whole power frequency cycle can be greater than 0, thereby ensuring that control logic in most of time is correct, and system also can be operated stably.

Figure 7:
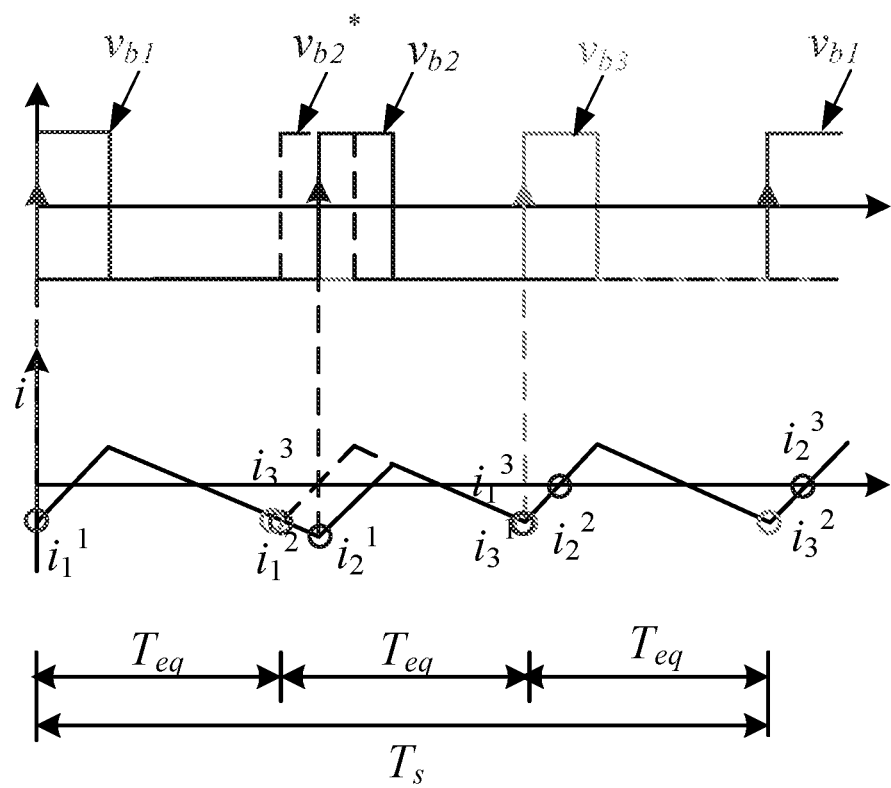
FIG. 7 is a schematic view of carrier phase-shifting when sampling several times.

Meanwhile, the number of samplings of the common state in each cycle can be multiple, for example, sampling is performed M times in each period. As shown in FIG. 7, it represents three power modules in total, each power module sampling three times. For example, three sampled values of the first power module are $i_1^1$, $i_1^2$ and $i_1^3$, and a time interval between two adjacent samplings is an equivalent carrier cycle $T_{eq}$. As for the k-th power module, the carrier frequency is:

$$f_k = f_{sref} + K_p \left( i_k^1 - \frac{i_k^1 + i_k^2 + \ldots + i_k^N}{M} \right)$$

The formula represents regulating the carrier frequency according to a relative size of the first sampling and an average value of the M samplings of the power module, and when each sampling is equal to the average value of the M sampled values, i.e the M sampled values are consistence, thereby the optimal carrier phase-shifting state is reached. In this embodiment, the number of samplings M is equal to the number of power modules N, i.e., three times.

Figure 8A:
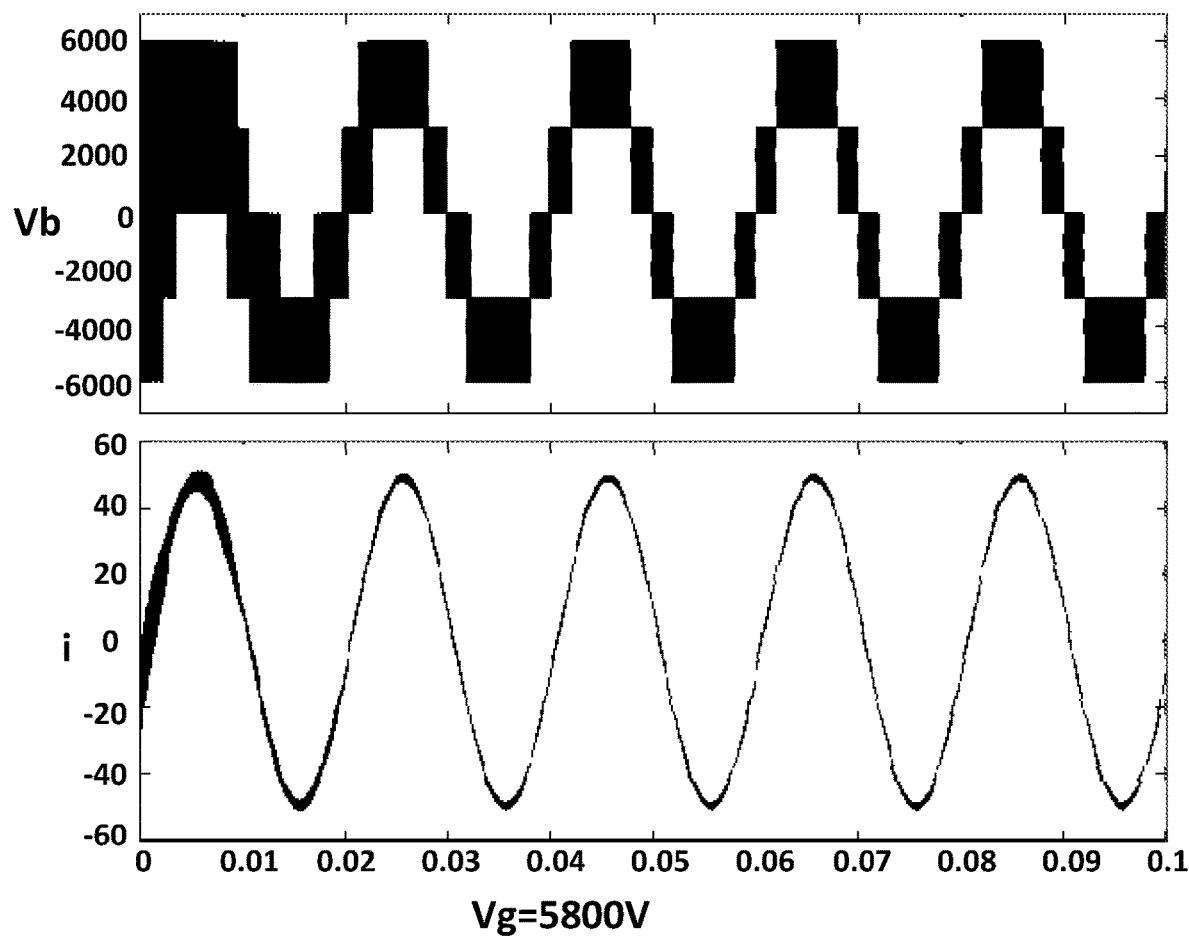
FIGS. 8A-8C are simulation waveforms in the example of the cascade system shown in FIG. 3.
Figure 8B:
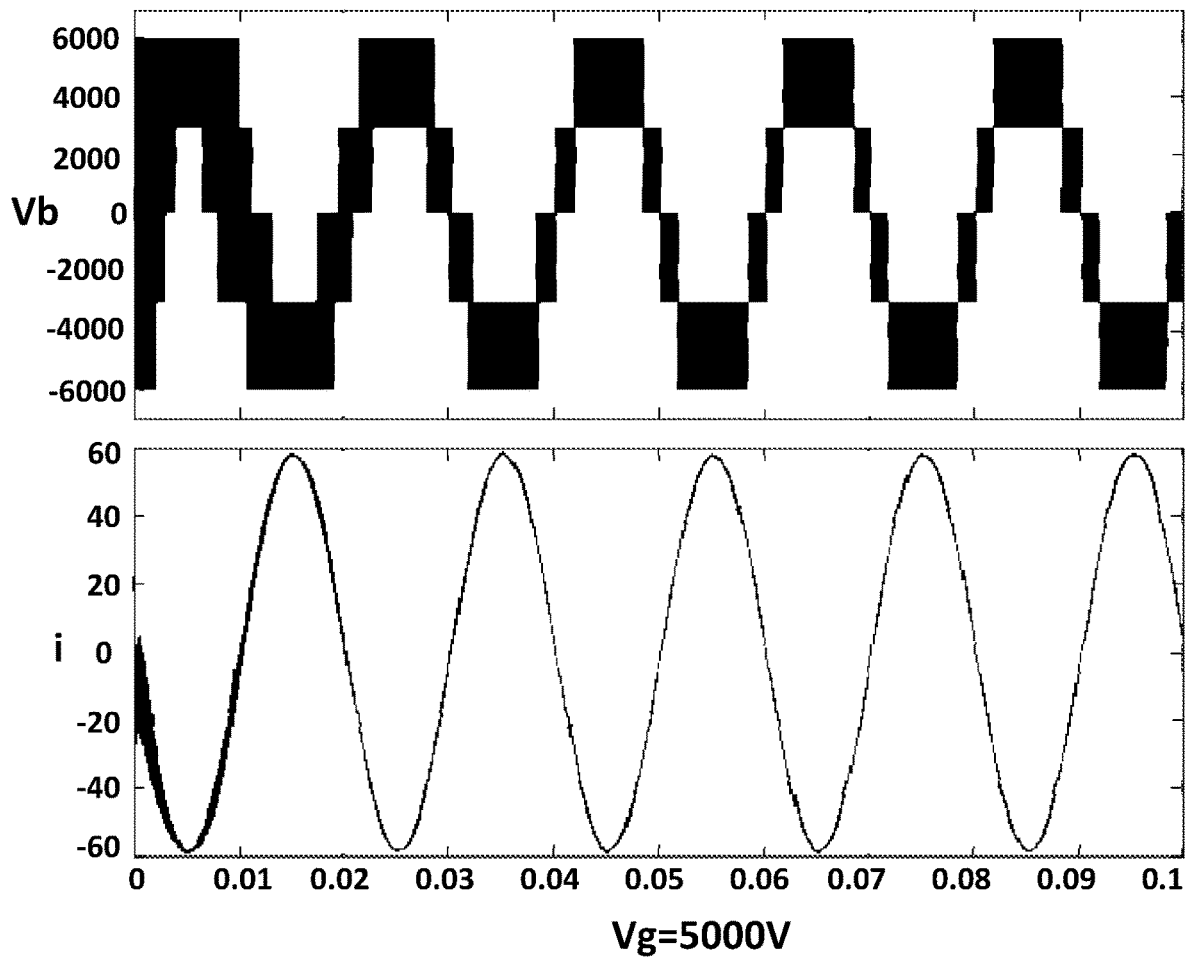
Figure 8C:
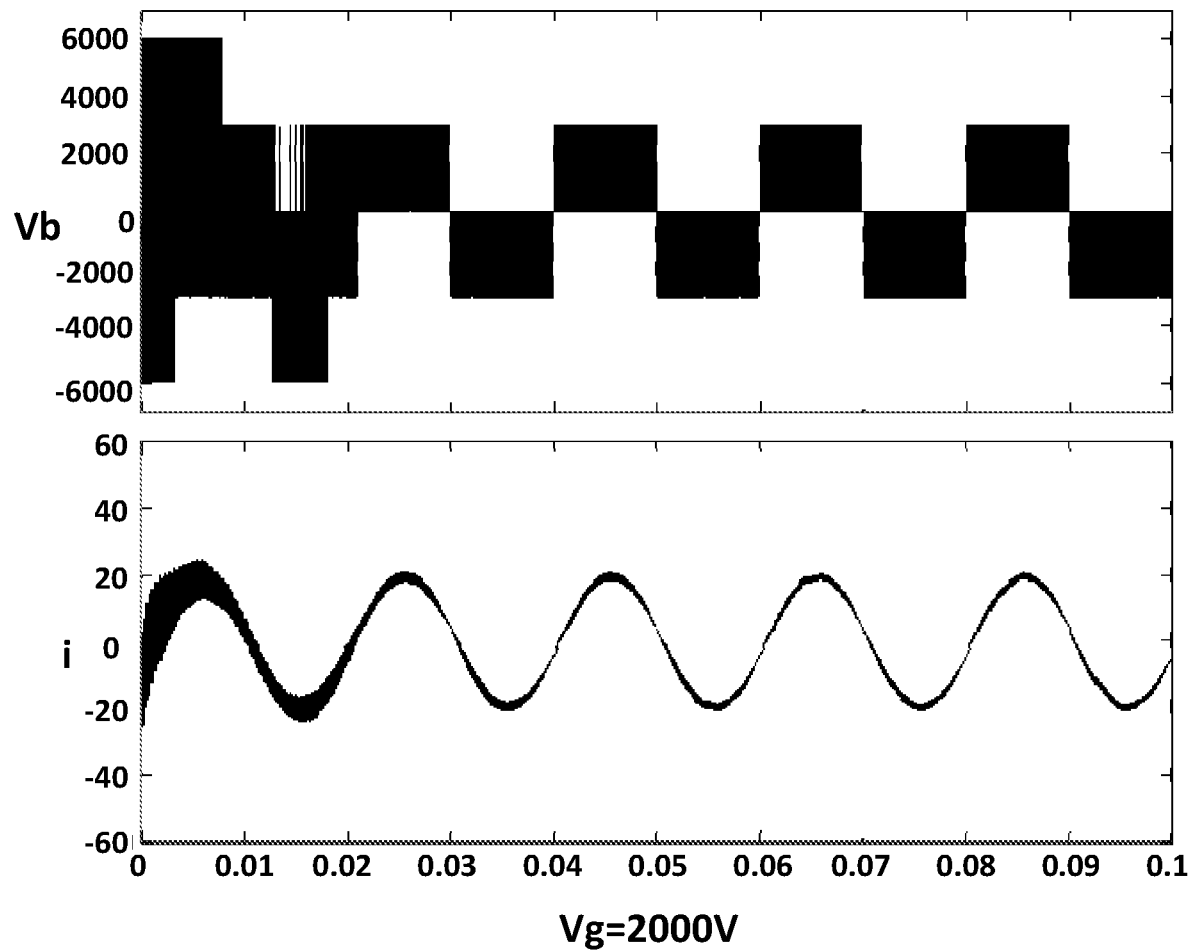

Simulation waveforms in the example of the cascade system shown in FIG. 3 of the application are shown in FIGS. 8A-8C. Taking N=4 for example, $V_{dc}$ of each power module is 1500V. As can be seen from FIGS. 8A-8C, under working conditions of various power grid voltages, carrier phase-shifting is stable, such that a current ripple is minimized. Different working conditions of AC voltages correspond to different duty ratios, and the system is operated stably under various duty ratios.

Figure 9:
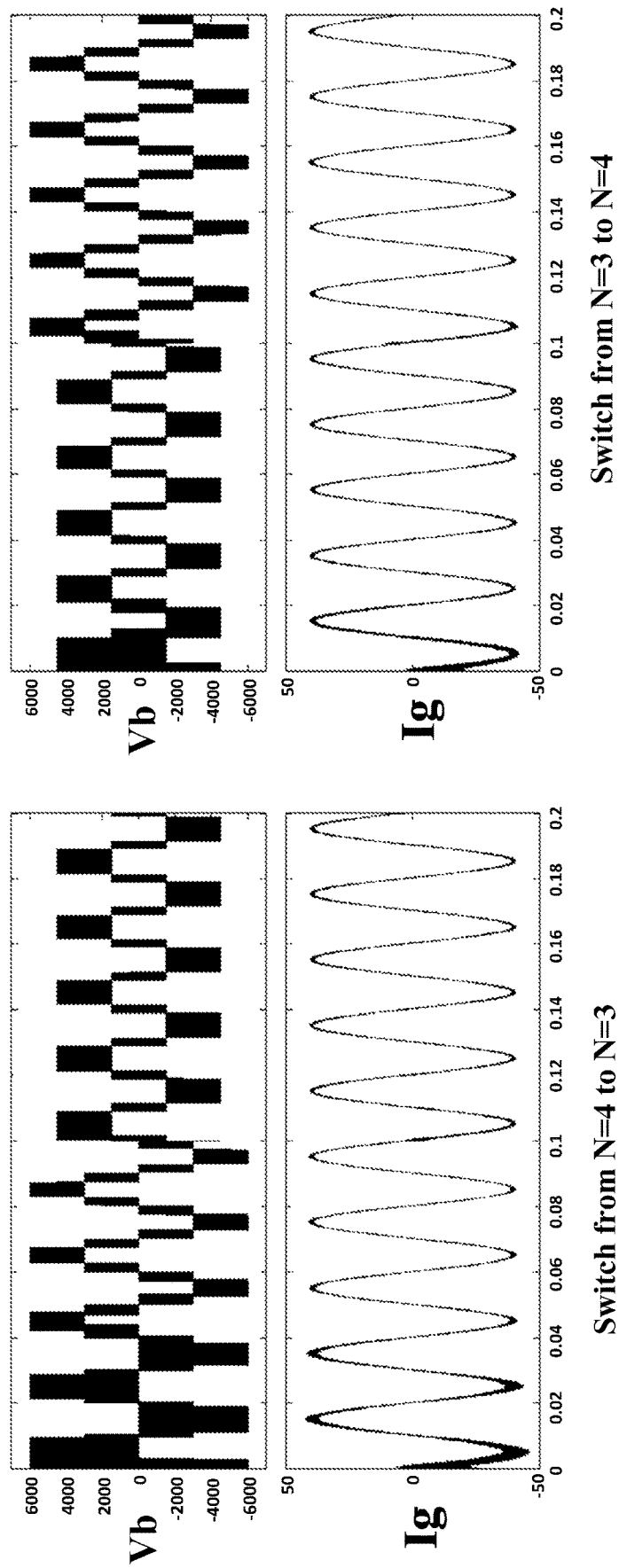
FIG. 9 is simulation waveforms when different numbers of power modules are switched in the example of the cascade system shown in FIG. 3.

Since the application has a certain tolerance for the sampling interval, proportional control is used without controlling of the two sampled values to be completely consistent. As for the cascade system, when the power module is switched between N=4 and N=3, simulation waveforms are shown in FIG. 9. If four power modules are put into operation at the beginning, the equivalent carrier cycle is $T_{eq}=T_s/4$, and when one power module exits operation, and the remaining three power modules are operated, since the control modules of the respective power modules of the system do not communicate, and the respective control modules cannot know the total number N of power modules has been changed, sampling is also performed at an interval $T_{eq}=T_s/4$, and system also can be stable. If three power modules are put into operation at the beginning, the equivalent carrier cycle is $T_{eq}=T_s/3$, and when one power module is loaded, and four power modules are operated, since the control modules of the respective power modules of the system do not communicate, and the respective control modules cannot know the total number N of power modules has been changed, sampling is also performed at an interval $T_{eq}=T_s/3$, and system also can be stable. Therefore, the dispersed carrier phase-shifting method in the application can automatically support loading and exit of a certain number of power modules.

Figure 10:
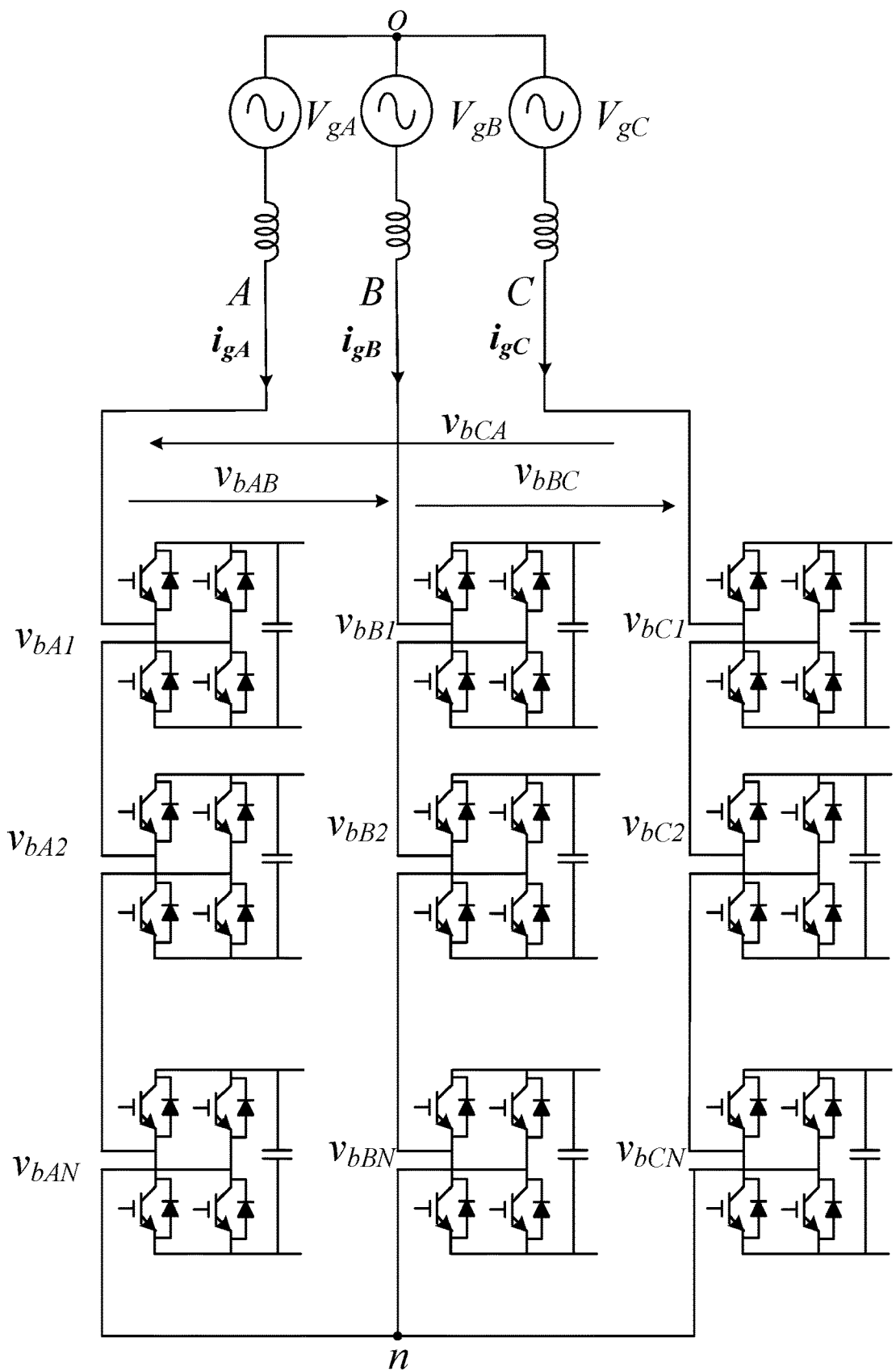
FIG. 10 is a view illustrating circuit principle of a three phase Y-connection cascade system.
Figure 11:
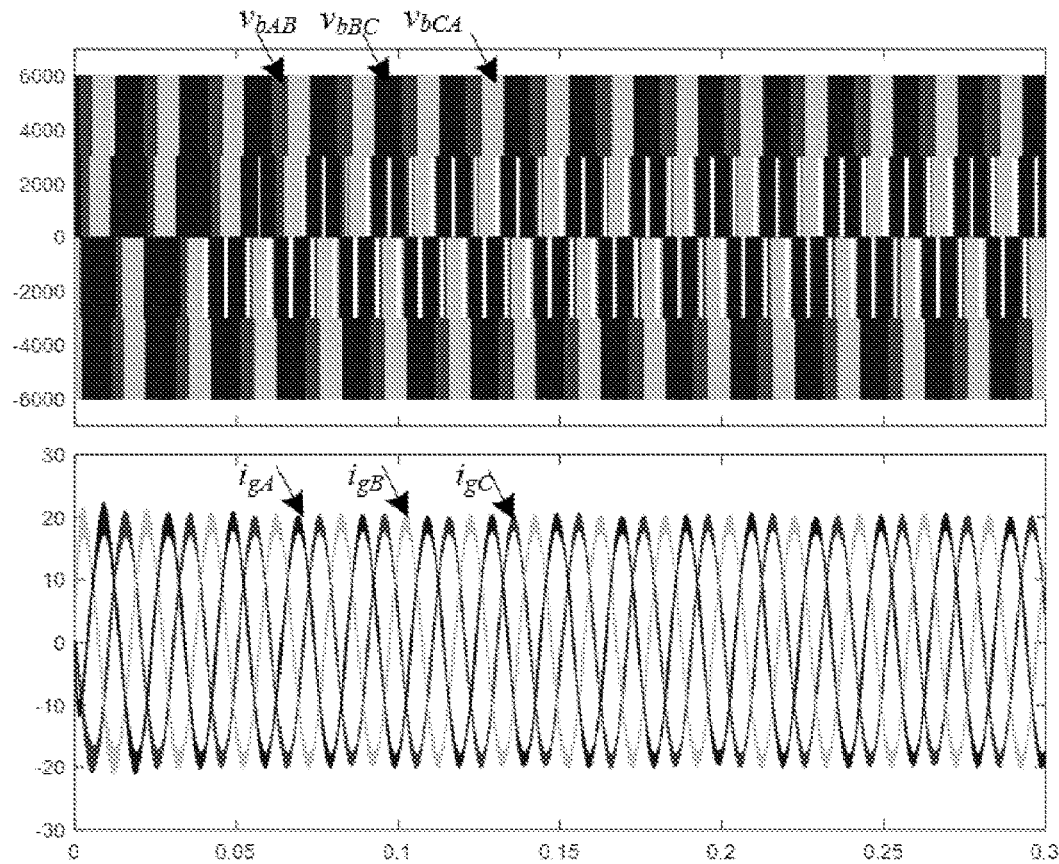
FIG. 11 is simulation waveforms in the example of the three phase Y-connection cascade system shown in FIG. 10.

The dispersed carrier phase-shifting method in the application also can be applied to a three phase Y-connection cascade system shown in FIG. 10. As for the three phase Y-connection cascade system, N power modules are cascaded as a single-phase bridge arm, and single-phase bridge arms are connected in a Y shape as a three phase Y-connection cascade system. As for the system, carrier phase-shifting may reduce current harmonic, the minimum current harmonic is equivalent to the minimum line voltage harmonic, and each line voltage is synthesized by bridge arm voltages of the 2N power modules, such as, $v_{bAB}=v_{bA1}+\ldots+v_{bAN}-(v_{bB1}+\ldots+v_{bBN})$. Each power module uses the dispersed carrier phase-shifting method in the application, the common state variate is a current flowing all power modules, the respective power modules use bipolar modulation, and an interval between the two adjacent sampling times is $$T_{delay}=\frac{T_s}{2N},$$

wherein $T_s$ is a switching cycle of each of the power module. Simulation effect is shown in FIG. 11. An initial phase is randomly given, harmonics are large, and after the dispersed carrier phase-shifting in the application is started, harmonics of three line voltages and three currents become smaller, and reach a stable state. In one embodiment, when the respective power modules can use doubling frequency unipolar modulation, an interval between the two adjacent sampling times is $$T_{delay}=\frac{T_s}{4N},$$

wherein $T_s$ is a switching cycle of each of the power module.

Figure 12:
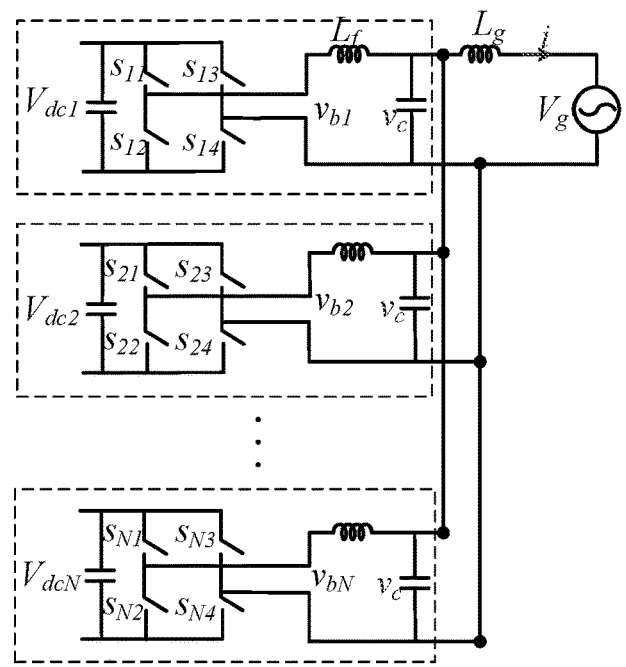
FIG. 12 is a view illustrating circuit principle of a parallel modular system.
Figure 13:
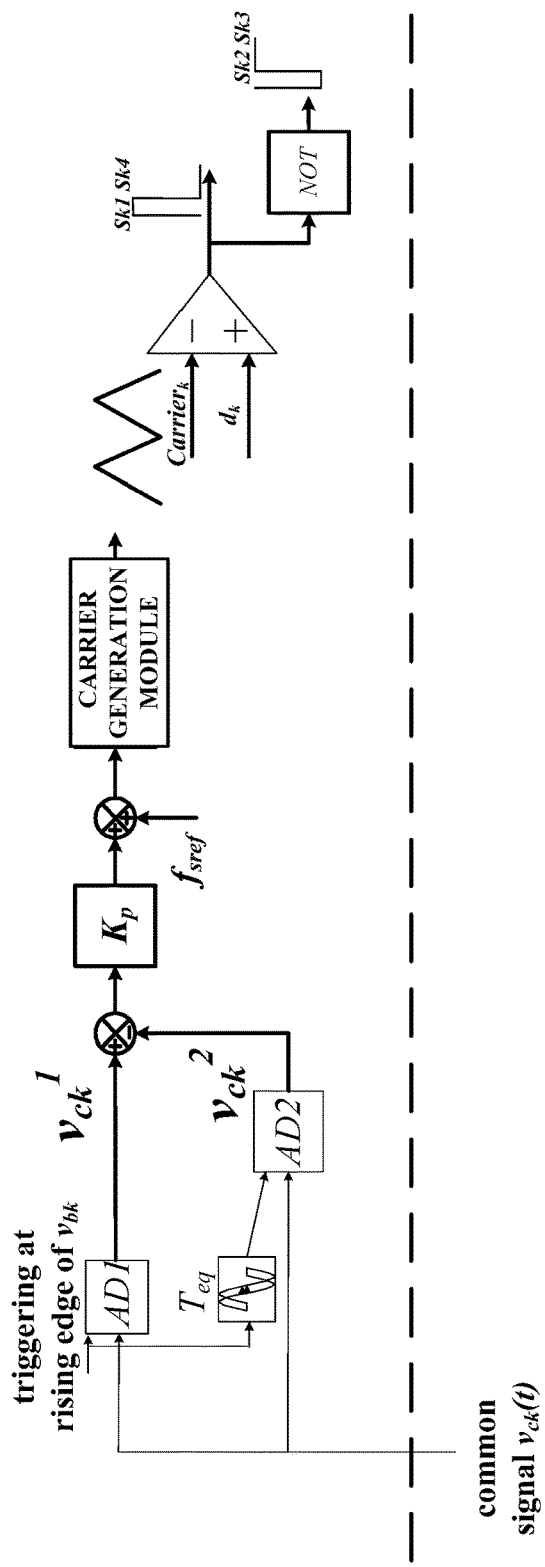
FIG. 13 is a view illustrating control principle of a dispersed carrier phase-shifting method in the example of the parallel modular system shown in FIG. 12.

As shown in FIG. 12, as for the parallel modular system, the carrier phase-shifting method is shown in FIG. 13. The parallel modular system uses a parallel port voltage as the common state variate, the respective control modules sample the common state variate, and the specific carrier phase-shifting control logic is consistent with that of the cascade system, so details are not described in this embodiment.

Figure 14:
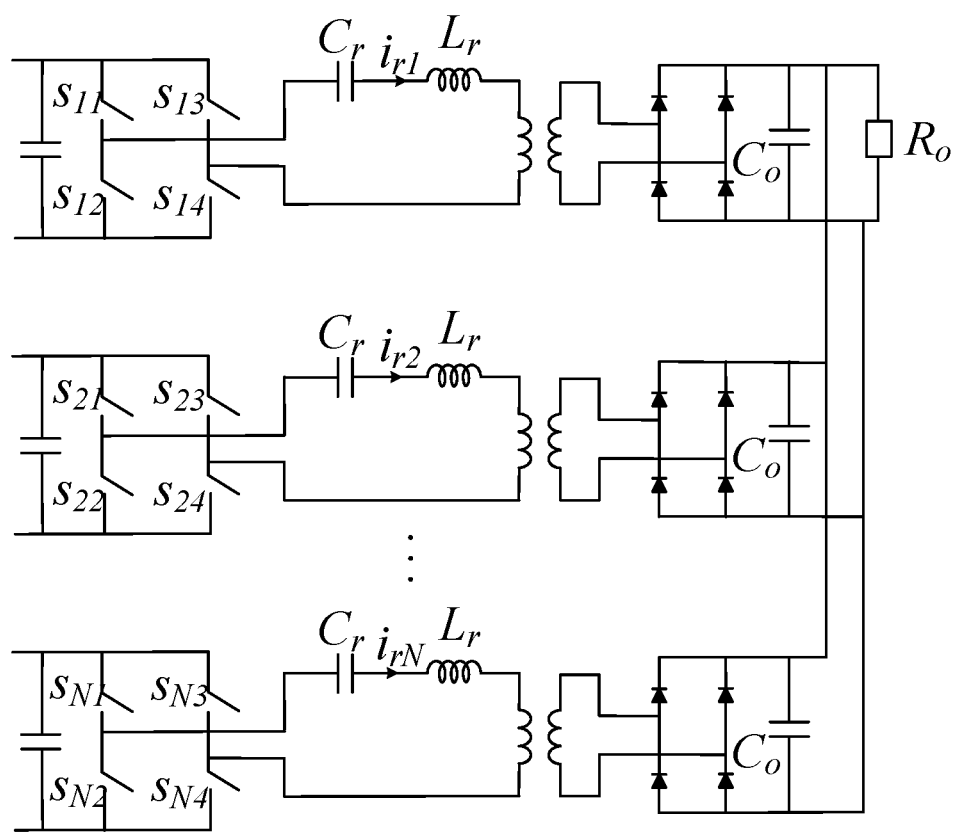
FIG. 14 is a view illustrating circuit principle of a multi-module LLC resonant conversion system.
Figure 15:
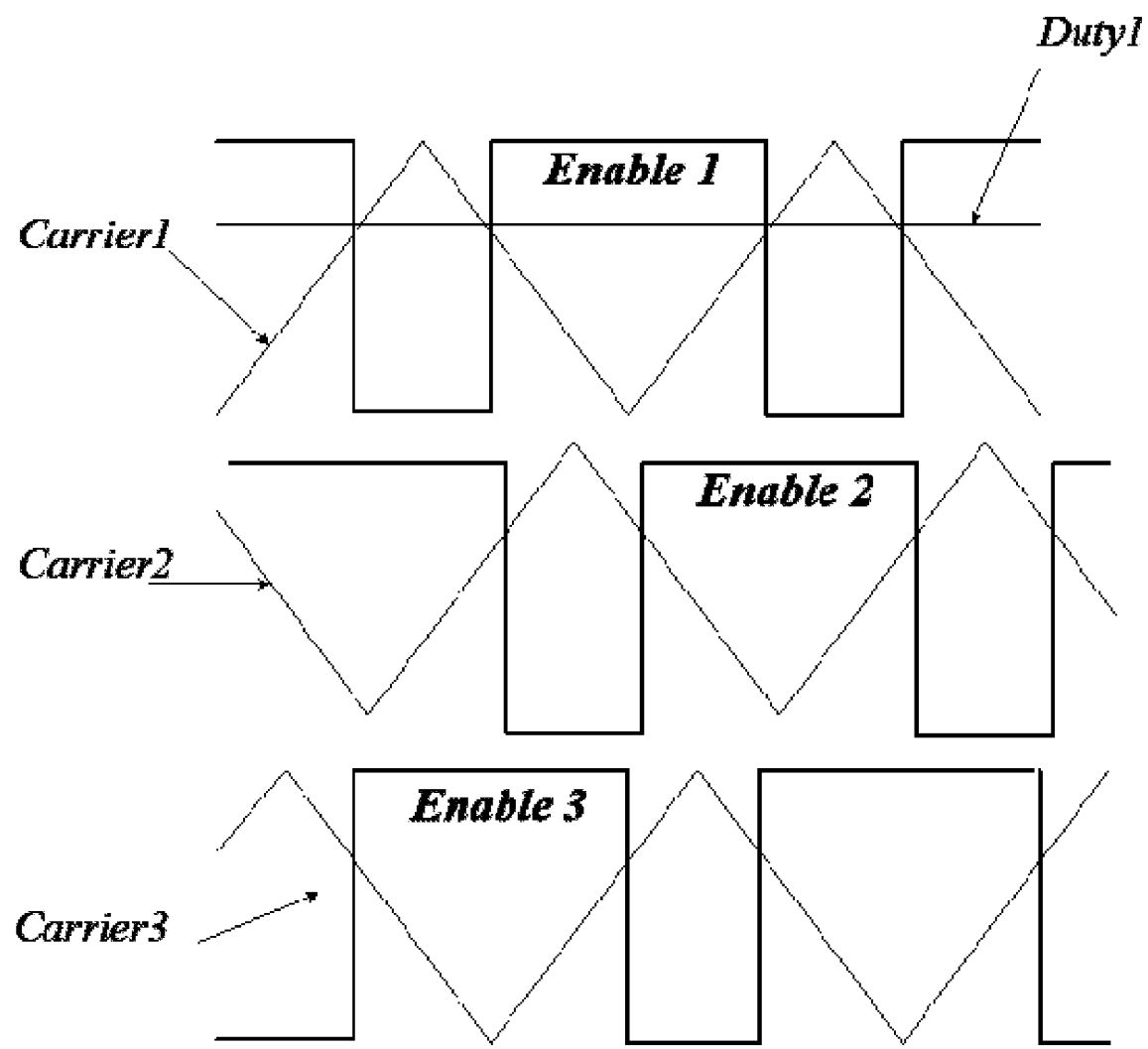
FIG. 15 is simulation waveforms using coordination Burst method in the example of the multi-module LLC resonant conversion system shown in FIG. 14.
Figure 16:
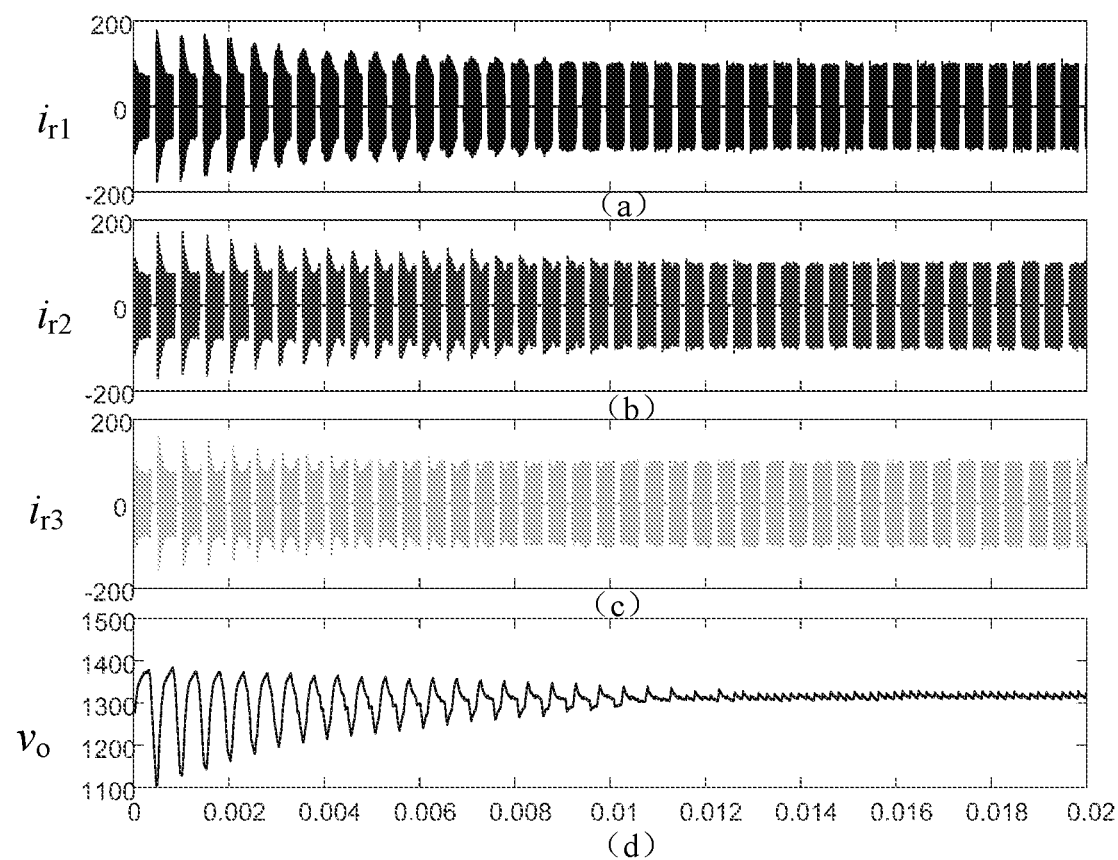
FIG. 16 is simulation waveforms using dispersed coordination Burst method in the example of the multi-module LLC resonant conversion system shown in FIG. 14.

Another preferable embodiment of the application is a multi-module LLC resonant converter parallel circuit shown in FIG. 14. Since the LLC has low efficiency when working continuously in a light load, it is often operated in a Burst mode, i.e., operating a period of time at a large power, then stopping working for a period of time, and working cyclically. In such way, operating efficiency can be improved, but ripple of an output voltage becomes larger. FIG. 15 is a schematic diagram of coordination Burst. Taking three power modules for example, each power module corresponds to one carrier wave, phase-shifting is performed between the carrier waves, the carrier cycle is an on-off period, and a duty ratio of an operating time is determined by additional control algorithm of voltage or current. Moreover, when coordination Burst operation of the dispersed carrier phase-shifting method in the application is used, the sampled common state variate is an output voltage. FIG. 16 is simulation effect of dispersed coordination Burst of the LLC, FIGS. 16(a), 16(b) and 16(c) show resonant currents of the respective power modules, and FIG. 16(d) shows an output voltage. At the beginning, the resonant currents work synchronously, and a ripple of the output voltage is very large. When the dispersed carrier phase-shifting method in the application is used, carrier phase-shifting is realized by dispersed closed-loop, and the ripple of the output voltage is reduced.

The above-mentioned embodiments only show partial applications of the dispersed carrier phase-shifting method in the application, and the method also can be applied to multiple modular series and parallel systems such as a three phase delta-connection cascade H-bridge system, a MMC modular multi-level converter, or a medium and high voltage DC/DC converter formed by cascade bridges.

To sum up, in the dispersed carrier phase-shifting method in the application, a control module is provided for each power module, each control module samples at least twice a common state variate, in which a reference time of first sampling time for each of the control modules is the same, such that a sign of a slope of the common state variate sampled at a first sampling time is opposite to a sign of a slope of the common state variate sampled at a second sampling time, and then a carrier frequency of the power module is regulated according to a relative size between a sampled value at the first sampling time and a sampled value at the second sampling time. The dispersed carrier phase-shifting method may implement carrier phase-shifting of the series or parallel modular system without mutual communication between the control modules, and meanwhile, under closed-loop control, the optimal carrier phase-shifting can be automatically achieved under various working conditions of duty ratios, thereby having good stability. Moreover, the method may automatically support power module exit operation or power module load operation, thereby realizing redundancy operation and plug and play. The method also may be applied to multiple modular series and parallel systems such as a three phase Y-connection cascade system, a three phase delta-connection cascade system, a multi-module LLC resonant converter parallel system, a MMC modular multi-level converter, or a medium and high voltage DC/DC converter formed by cascade bridges, and has great significance to improvement of flexibility and extendibility of the modular system.

The application also provides a dispersed carrier phase-shifting system, including:
 a modular system formed by connecting at least two power modules connected in series and/or in parallel;
 each of the power modules including a control module,
 the control module for sampling at least twice a common state variate, a sign of a slope of the common state variate sampled at a first sampling time is opposite to a sign of a slope of the common state variate sampled at a second sampling time, and a reference time of the first sampling time for each of the control modules is the same; and
 regulating a carrier frequency of the power module according to a relative size between a sampled value at the first sampling time and a sampled value at the second sampling time.

In some embodiments, the same reference time at the first sampling time includes that each power module performed sampling at a specific time of its own carrier cycle.

In some embodiments, the specific time includes a rising edge or a falling edge of respective switch, or a time lagging a same time interval from the rising edge or the falling edge, and/or a time when respective carrier wave crosses zero or a peak value.

In some embodiments, the at least two power modules are connected in series to form a series modular system, and as for the series modular system, the common state variate is a current flowing all power modules.

In some embodiments, the at least two power modules are connected in parallel to form a parallel modular system, and as for the parallel modular system, the common state variate is a parallel port voltage.

In some embodiments, an interval between the two adjacent sampling times is an equivalent carrier cycle $T_{eq}$;

when bipolar modulation is used, $$T_{eq} = \frac{T_s}{N};$$

and
when doubling frequency unipolar modulation is used, $$T_{eq} = \frac{T_s}{2N};$$

wherein $T_s$ is a carrier cycle of the power module, and N is the number of power modules, where N≥2.

In some embodiments, N power modules are cascaded as a single-phase bridge arm, and the single-phase bridge arm is connected in a Y shape as a three phase Y-connection cascade system;

when the respective power modules use bipolar modulation, an interval between the two adjacent sampling times is $$T_{delay} = \frac{T_s}{2N};$$

when the power modules use doubling frequency unipolar modulation, an interval between the two adjacent sampling times is $$T_{delay} = \frac{T_s}{4N},$$

wherein $T_s$ is a switching cycle of each of the power modules.

In some embodiments, the relative size between a sampled value at the first sampling time and a sampled value at the second sampling time of the k-th power module is taken as an input of a regulation controller, and an output of the regulation controller is added to a preset carrier frequency to obtain an actual carrier frequency of the power module; and the actual carrier frequency is taken as an input of a carrier generation module to produce a driving signal of the power module.

In some embodiments, the regulation controller is a proportional controller, a proportional integral controller, a proportional differential controller or a proportional integral differential controller.

In some embodiments, the regulation controller is the proportional controller, and a method of obtaining a proportional control coefficient $K_p$ of the regulation controller is:

$$\begin{cases} K_p < 0, \text{ when } d < 1/N \\ K_p > 0, \text{ when } d > 1/N \end{cases},$$

wherein d is a duty ratio of the power module.

In some embodiments, the regulation controller is the proportional controller, the number N of power modules is greater than 3, and the proportional control coefficient $K_p$ of the regulation controller in a whole power frequency cycle is greater than 0.

In some embodiments, the actual carrier frequency of the k-th power module is:

$$f_k = f_{sref} + K_p\left(a_k^1 - \frac{a_k^1 + a_k^2 + \ldots + a_k^M}{M}\right),$$

wherein $f_{sref}$ is the preset carrier frequency of the power module, $a_k^i$, i=1, ..., M is a sampled value of the k-th power module at the i-th sampling time, and M represents the number of samplings in the carrier cycle $T_s$ of the power module.

The descriptions and drawings above only provide examples as the technical concept of the disclosure, and those ordinary in the art shall understand that without departing from essential features of the disclosure, various modifications and changes in form may be made to the embodiments described above, such as, combination, separation, substitution and change of the construction. Therefore, the embodiments disclosed in the disclosure do not aim to limit but describing the technical concept of the disclosure, so the scope of the technical concept of the disclosure is not limited. The scope of the disclosure shall be explained based on the appended claims, and all technical concepts included in the equivalent scope of the appended claims shall be explained to be included into the scope of the disclosure.

Of course, the invention may further have various other embodiments, and those skilled in the art shall make various corresponding modifications and variations to the invention without departing from spirit and essence of the invention, but these corresponding modifications and variations shall belong to the scope protected by the appended claims of the invention.

What is claimed is:

1. A dispersed carrier phase-shifting method, comprising:
connecting at least two power modules in series and/or in parallel to form a modular system;
each of the power modules comprising a control module for sampling at least twice a common state variate, a sign of a slope of the common state variate sampled at a first sampling time is opposite to a sign of a slope of the common state variate sampled at a second sampling time, and a reference time of the first sampling time for each of the control modules is the same; and
regulating a carrier frequency of the power module according to a relative size between a sampled value at the first sampling time and a sampled value at the second sampling time.

2. The dispersed carrier phase-shifting method according to claim 1, wherein,
the reference time of the first sampling time comprises that each power module performs sampling at a specific time of its own carrier cycle itself.

3. The dispersed carrier phase-shifting method according to claim 2, wherein the specific time comprises a rising edge or a falling edge of respective switch, a time lagging a same time interval from the rising edge or the falling edge, or a time when respective carrier wave crosses zero or a peak value.

4. The dispersed carrier phase-shifting method according to claim 1, wherein the at least two power modules are connected in series to form a series modular system, and as for the series modular system, the common state variate is a current flowing all power modules.

5. The dispersed carrier phase-shifting method according to claim 1, wherein the at least two power modules are connected in parallel to form a parallel modular system, and as for the parallel modular system, the common state variate is a parallel port voltage.

6. The dispersed carrier phase-shifting method according to claim 1, wherein an interval between two adjacent sampling times is an equivalent carrier cycle $T_{eq}$;

when bipolar modulation is used, $$T_{eq} = \frac{T_s}{N};$$

and
when doubling frequency unipolar modulation is used, $$T_{eq} = \frac{T_s}{2N};$$

wherein $T_s$ is a carrier cycle of the power module, and N is the number of power modules, where N≥2.

7. The dispersed carrier phase-shifting method according to claim 1, wherein,

N power modules are cascaded as a single-phase bridge arm, and the single-phase bridge arm is connected in a Y shape as a three phase Y-connection cascade system;

when the respective power modules use bipolar modulation, an interval between the two adjacent sampling times is $$T_{delay} = \frac{T_s}{2N};$$

when the power modules use doubling frequency unipolar modulation, an interval between the two adjacent sampling times is $$T_{delay} = \frac{T_s}{4N},$$

wherein $T_s$ is a switching cycle of each of the power modules.

8. The dispersed carrier phase-shifting method according to claim 1, wherein the step of regulating a carrier frequency of the power module according to a relative size between the sampled value at the first sampling time and the sampled value at the second sampling time comprises:

taking the relative size between a sampled value at the first sampling time and a sampled value at the second sampling time of the k-th power module as an input of a regulation controller, and adding an output of the regulation controller to a preset carrier frequency to obtain an actual carrier frequency of the power module; and taking the actual carrier frequency as an input of a carrier generation module to produce a driving signal of the power module.

9. The dispersed carrier phase-shifting method according to claim 8, wherein the regulation controller is a proportional controller, a proportional integral controller, a proportional differential controller or a proportional integral differential controller.

10. The dispersed carrier phase-shifting method according to claim 9, wherein the regulation controller is the proportional controller, and a method of obtaining a proportional control coefficient $K_p$ of the regulation controller is:

$$\begin{cases} K_p < 0, \text{ when } d < 1/N \\ K_p > 0, \text{ when } d > 1/N \end{cases},$$

wherein d is a duty ratio of the power module.

11. The dispersed carrier phase-shifting method according to claim 9, wherein the regulation controller is the proportional controller, the number N of power modules is greater than 3, and the proportional control coefficient $K_p$ of the regulation controller in a whole power frequency cycle is greater than 0.

12. The dispersed carrier phase-shifting method according to claim 10, wherein, the actual carrier frequency of the k-th power module is:

$$f_k = f_{sref} + K_p\left(a_k^1 - \frac{a_k^1 + a_k^2 + \ldots + a_k^M}{M}\right),$$

wherein $f_{sref}$ is the preset carrier frequency of the power module, $a_k^i$, i=1, ..., M is a sampled value of the k-th power module at the i-th sampling time, and M represents the number of samplings in the carrier cycle $T_s$ of the power module.

13. A dispersed carrier phase-shifting system, comprising:
a modular system formed by connecting at least two power modules in series and/or in parallel;
each of the power modules comprising a control module, the control module for sampling at least twice a common state variate, a sign of a slope of the common state variate sampled at a first sampling time is opposite to a sign of a slope of the common state variate sampled at a second sampling time, and a reference time of the first sampling time of each of the control modules is the same; and
regulating a carrier frequency of the power module according to a relative size between a sampled value at the first sampling time and a sampled value at the second sampling time.

14. The dispersed carrier phase-shifting system according to claim 13, wherein,
the reference time of the first sampling time comprises that each power module performs sampling at a specific time of its own carrier cycle.

15. The dispersed carrier phase-shifting system according to claim 14, wherein the specific time comprises a rising edge or a falling edge of respective switch, or a time lagging a same time interval from the rising edge or the falling edge, or a time when respective carrier wave crosses zero or a peak value.

16. The dispersed carrier phase-shifting system according to claim 13, wherein the at least two power modules are connected in series to form a series modular system, and as for the series modular system, the common state variate is a current flowing all power modules.

17. The dispersed carrier phase-shifting system according to claim 13, wherein the at least two power modules are connected in parallel to form a parallel modular system, and as for the parallel modular system, the common state variate is a parallel port voltage.

18. The dispersed carrier phase-shifting system according to claim 13, wherein an interval between the two adjacent sampling times is an equivalent carrier cycle $T_{eq}$;
when bipolar modulation is used, $$T_{eq} = \frac{T_s}{N};$$

and
when doubling frequency unipolar modulation is used, $$T_{eq} = \frac{T_s}{2N};$$

wherein $T_s$ is a carrier cycle of the power module, and N is the number of power modules, where N≥2.

19. The dispersed carrier phase-shifting system according to claim 18, wherein,
N power modules are cascaded as a single-phase bridge arm, and the single-phase bridge arm is connected in a Y shape as a three phase Y-connection cascade system;
when the respective power modules use bipolar modulation, an interval between the two adjacent sampling times is $$T_{delay} = \frac{T_s}{2N};$$

when the power modules use doubling frequency unipolar modulation, an interval between the two adjacent sampling times is $$T_{delay} = \frac{T_s}{4N},$$

wherein $T_s$ is a switching cycle of each of the power modules.

20. The dispersed carrier phase-shifting system according to claim 13, wherein,
the relative size between the sampled value at the first sampling time and the sampled value at the second sampling time of the k-th power module is taken as an input of a regulation controller, and an output of the regulation controller is added to a preset carrier frequency to obtain an actual carrier frequency of the power module; and
the actual carrier frequency is taken as an input of a carrier generation module to produce a driving signal of the power module.

21. The dispersed carrier phase-shifting system according to claim 20, wherein the regulation controller is a proportional controller, a proportional integral controller, a proportional differential controller or a proportional integral differential controller.

22. The dispersed carrier phase-shifting system according to claim 21, wherein the regulation controller is the proportional controller, and a method of obtaining a proportional control coefficient $K_p$ of the regulation controller is:

$$\begin{cases} K_p < 0, \text{ when } d < 1/N \\ K_p > 0, \text{ when } d > 1/N \end{cases},$$

wherein d is a duty ratio of the power module.

23. The dispersed carrier phase-shifting system according to claim 21, wherein the regulation controller is the proportional controller, the number N of power modules is greater than 3, and the proportional control coefficient $K_p$ of the regulation controller in a whole power frequency cycle is greater than 0.

24. The dispersed carrier phase-shifting system according to claim 23, wherein,
the actual carrier frequency of the k-th power module is:

$$f_k = f_{sref} + K_p\left(a_k^1 - \frac{a_k^1 + a_k^2 + \ldots + a_k^M}{M}\right),$$

wherein $f_{sref}$ is the preset carrier frequency of the power module, $a_k^i$, i=1, ..., M is a sampled value of the k-th power module at the i-th sampling time, and M represents the number of samplings in the carrier cycle $T_s$ of the power module.

* * * * *